(12) United States Patent
Grinstead et al.

(10) Patent No.: US 11,467,238 B2
(45) Date of Patent: Oct. 11, 2022

(54) METHOD FOR UNIFORM RECONSTRUCTION OF MULTI-CHANNEL SURFACE-COIL MAGNETIC RESONANCE DATA WITHOUT USE OF A REFERENCE SCAN

(71) Applicants: Mayo Foundation for Medical Education and Research, Rochester, MN (US); Siemens Healthcare GmbH, Erlangen (DE)

(72) Inventors: John Grinstead, Portland, OH (US); Matthew A. Frick, Rochester, MN (US); Vibhas Deshpande, Austin, TX (US); Kimberly K. Amrami, St. Paul, MN (US); Venkata Veerendranadh Chebrolu, Rochester, MN (US); Joel P. Felmlee, Rochester, MN (US); Peter Kollasch, Minnetonka, MN (US)

(73) Assignees: Mayo Foundation for Medical Education and Research, Rochester, MN (US); Siemens Healthcare GmbH, Erlangen (DE)

( * ) Notice: Subject to any disclaimer, the term of this patent is extended or adjusted under 35 U.S.C. 154(b) by 3 days.

(21) Appl. No.: 17/059,924

(22) PCT Filed: Jun. 3, 2019

(86) PCT No.: PCT/US2019/035167
§ 371 (c)(1),
(2) Date: Nov. 30, 2020

(87) PCT Pub. No.: WO2019/232518
PCT Pub. Date: Dec. 5, 2019

(65) Prior Publication Data
US 2021/0208226 A1 Jul. 8, 2021

Related U.S. Application Data

(60) Provisional application No. 62/679,638, filed on Jun. 1, 2018.

(51) Int. Cl.
*G01R 33/48* (2006.01)
*G01R 33/56* (2006.01)
*G01R 33/565* (2006.01)

(52) U.S. Cl.
CPC ....... *G01R 33/4828* (2013.01); *G01R 33/565* (2013.01); *G01R 33/5608* (2013.01)

(58) Field of Classification Search
USPC .......................................... 324/309
See application file for complete search history.

(56) References Cited

U.S. PATENT DOCUMENTS

2008/0175458 A1* 7/2008 Guo .................. G01R 33/5611
   382/131
2008/0292167 A1* 11/2008 Todd ................. G01R 33/4804
   382/131

(Continued)

OTHER PUBLICATIONS

Anonymous. "ismrmrd/test_recon_dataset.mat master. Ismrmrd/ismmnrd . GitHub", Jan. 26, 2018. Retrieved from the Internet: url:https://github.com/ismrmrm/ismrmrd/blob/master/examples/matlab/test_recon_dataset.m. Retrieved Aug. 30, 2019.

(Continued)

*Primary Examiner* — Rodney E Fuller
(74) *Attorney, Agent, or Firm* — Quarles & Brady LLP

(57) ABSTRACT

Systems and methods for generating images with a magnetic resonance imaging ("MRI") system, in which the images have been corrected for receive coil nonuniformities are described. Improved data acquisition schemes for fat saturation are also described.

26 Claims, 6 Drawing Sheets

(56) References Cited

U.S. PATENT DOCUMENTS

| | | | |
|---|---|---|---|
| 2012/0083687 A1* | 4/2012 | Parker | G01R 33/5673 600/419 |
| 2015/0115958 A1* | 4/2015 | Wang | G01R 33/4835 324/309 |

OTHER PUBLICATIONS

Axel L, et al. Intensity correction in surface-coil MR imaging. Am J Roentgenol 1987;148:418-420.

Bangerter NK, et al. Quantitative techniques for musculoskeletal MRI at 7 Tesla. Quant Imaging Med Surg 2016;6:715-730.

Belaroussi B, et al. Intensity nonuniformity correction in MRI: Existing methods and their validation. Med Image Anal 2006;10:234-246.

Bley, T. A., et al. "Fat and water magnetic resonance imaging." Journal of Magnetic Resonance Imaging 31.1 (2010): 4-18.

Boyes RG, et al. Intensity nonuniformity correction using N3 on 3-T scanners with multichannel phased array coils. Neuroimage 2008;39:1752-1762.

Cao, M., et al. "Estimation of images and sensitivities for multi-coil MRI." Proc Intl Soc Mag Res Med. vol. 2447. 2005.

Chebrolu, V. V., et al. "Uniform combined reconstruction (UNI-CORN) of multichannel surface-coil Data at 7T without use of a Reference Scan", Proceedings of the International Society for Magnetic Resonance in Medicine, ISMRM, Joint Annual Meeting ISMRM-ESMRMB, Paris, France, Jun. 16-21, 2018.

Chebrolu, V. V., et al. "Uniform combined reconstruction of multichannel 7T knee MRI receive coil data without the use of a reference scan." Journal of Magnetic Resonance Imaging 50.5 (2019): 1534-1544.

Collins CM, et al. Combination of optimized transmit arrays and some receive array reconstruction methods can yield homogeneous images at very high frequencies. Magn Reson Med 2005;54:1327-1332.

Dean Deyle G. The role of MRI in musculoskeletal practice: A clinical perspective. J Man Manip Ther 2011;19:152-161.

Del Grande F, et al. Fat-suppression techniques for 3-T MR imaging of the musculoskeletal system. RadioGraphics 2014;34:217-233.

Erdogmus, D., et al. "Image construction methods for phased array magnetic resonance imaging." Journal of Magnetic Resonance Imaging: An Official Journal of the International Society for Magnetic Resonance in Medicine 20.2 (2004): 306-314.

Ganzetti M, et al. Intensity inhomogeneity correction of structural MR images: A data-driven approach to define input algorithm parameters. Front Neuroinform 2016;10.

Ganzetti M, et al. Quantitative evaluation of intensity inhomogeneity correction methods for structural MR brain images. Neuroinformatics 2016;14:5-21.

Griswold MA, et al. Generalized autocalibrating partially parallel acquisitions (GRAPPA). Magn Reson Med 2002;47(6):1202-1210.

International Searching Authority. International Search Report and Written Opinion for application PCT/US2019/035167. dated Nov. 4, 2019. 27 pages.

Koo TK, et al. A guideline of selecting and reporting intraclass correlation coefficients for reliability research. J Chiropr Med 2016;15: 155-163.

Kwok WE, et al. High-resolution uniform MR imaging of finger joints using a dedicated RF coil at 3T. J Magn Reson Imaging 2010; 31:240-247.

Li C, et al. Multiplicative intrinsic component optimization (MICO) for MRI bias field estimation and tissue segmentation. Magn Reson Imaging 2014;32:913-923.

Luesebrink F, et al. Quantitative and qualitative evaluation of bias field correction methods. In: Proc 26th Annual Meeting ISMRM, Honolulu; 2017 (abstract 1451).

Marques JP, et al. MP2RAGE, a self bias-field corrected sequence for improved segmentation and T1-mapping at high field. Neuroimage 2010;49:1271-1281.

McGraw KO, et al. Forming inferences about some intraclass correlation coefficients. Psychol Methods 1996;1:30-46.

McVeigh ER, et al. Phase and sensitivity of receiver coils in magnetic resonance imaging. Med Phys 1986;13: 806-814.

Miller CA, et al. Quantitative pixelwise measurement of myocardial blood flow: The impact of surface coil-related field inhomogeneity and a comparison of methods for its correction. J Cardiovasc Magn Reson 2015;17:11-19.

Ogasawara G, et al. Image nonuniformity correction for 3-T Gd-EOB-DTPA-enhanced MR imaging of the liver. Magn Reson Med Sci 2017;16:115-122.

Regatte RR, et al. Ultra-high-field MRI of the musculoskeletal system at 7.0T. J Magn Reson Imaging 2007;25:262-269.

Ren H, et al. Surface coil intensity correction in magnetic resonance imaging in spinal metastases. Open Med 2017;12:138-143.

Roemer, P. B., et al. "The NMR phased array." Magnetic resonance in medicine 16.2 (1990): 192-225.

Sage JE, et al. Musculoskeletal MRI. Vet Clin North Am Small Anim Pract 2016;46:421-451.

Tustison NJ, et al. N4ITK: Improved N3 bias correction. IEEE Trans Med Imaging 2010;29:1310-1320.

Uecker, M., et al. "ESPIRiT—an eigenvalue approach to autocalibrating parallel MRI: where SENSE meets GRAPPA." Magnetic resonance in medicine 71.3 (2014): 990-1001.

Ugurbil K. Imaging at ultrahigh magnetic fields: History, challenges, and solutions. Neuroimage 2018;168:7-32.

Uwano I, et al. Intensity inhomogeneity correction for magnetic resonance imaging of human brain at 7T. Med Phys 2014; 41:022302.

Van De Moortele P-F, et al. B1 destructive interferences and spatial phase patterns at 7 T with a head transceiver array coil. Magn Reson Med 2005;54:1503-1518.

Vaughan JT, et al. 7T vs. 4T: RF power, homogeneity, and signal-to-noise comparison in head images. Magn Reson Med 2001;46:24-30.

Vemuri, P., et al. "Coil sensitivity estimation for optimal SNR reconstruction and intensity inhomogeneity correction in phased array MR imaging." Biennial international conference on information processing in medical imaging. Springer, Berlin, Heidelberg, 2005.

Vovk, U., et al. "A review of methods for correction of intensity inhomogeneity in MRI." IEEE transactions on medical imaging 26.3 (2007): 405-421.

Wald LL, et al. Phased array detectors and an automated intensity-correction algorithm for high-resolution MR imaging of the human brain. Magn Reson Med 1995;34:433-439.

Woolson RF. Wilcoxon signed-rank test. In: Wiley Encyclopedia of Clinical Trials. Hoboken, NJ: John Wiley & Sons; 2008:1-3.

\* cited by examiner

METHOD FOR UNIFORM RECONSTRUCTION OF MULTI-CHANNEL SURFACE-COIL MAGNETIC RESONANCE DATA WITHOUT USE OF A REFERENCE SCAN

CROSS-REFERENCE TO RELATED APPLICATIONS

This application is a 371 U.S. National Phase application of PCT/US2019/035167, filed Jun. 3, 2019, which claims the benefit of U.S. Provisional Patent Application Ser. No. 62/679,638 filed on Jun. 1, 2018 and entitled "Methods for Uniform Reconstruction of Multi-Channel Surface-Coil Data Without use of a Reference Scan," which is herein incorporated by reference in its entirety.

BACKGROUND

Fat suppression or saturation ("fat-sat") is a clinically important tool in many scenarios for improving diagnosis and quantification in magnetic resonance imaging ("MRI"). Hyper intense signal from fat in MRI may obscure pathology such as inflammation or edema. Fat-sat is also used to improve the dynamic range of the MR image and to increase contrast between pathological and normal tissue in sequences sensitive to fluid. Assessment of bone marrow (lesions), cartilage, and menisci becomes easier with fat-sat. Cartilage imaging also benefits from fat-sat because of the reduction of chemical-shift artifacts. Exogenous contrast enhanced imaging sequences use fat-sat to better visualize or quantify the dynamics of contrast enhancement. For example, fat-sat improves the contrast-to-noise ratio in MR orthography. Accurate and uniform fat-sat is also important for evaluating fat content of tumors.

Fat is suppressed in MRI using the chemical-shift and/or the difference in the $T_1$ values between water and fat protons. Chemical-shift selective ("CHESS") and Dixon methods use the chemical-shift (or the frequency difference) between water and fat protons for suppressing or separating the fat signal. The CHESS fat-suppression method selectively excites the fat protons using a 90 degree flip-angle RF pulse and saturates the fat-signal using dephasing gradients. The uniformity of fat-sat with CHESS depends on $B_0$ and $B_1$ homogeneity.

Dixon methods acquire data at different echo-times with different phase accumulation between water and fat and use the phase difference to separate water and fat signals. Dixon methods are typically longer in duration due to acquisition of multiple echoes and might be motion sensitive. The uniformity of fat-suppression with Dixon methods depends on the reconstruction method used and might be affected by water-fat swap issues. If acceleration methods are used to reduce scan time, then the sharpness of the images with Dixon is lower compared to the CHESS method.

A short inversion-time inversion recovery ("STIR") sequence uses the $T_1$ difference between water and fat protons to suppress the fat signal. The STIR sequence inverts both fat and water protons (using a 180 degree RF pulse) and applies the subsequent excitation pulse at a time corresponding to the null time in the $T_1$ recovery of the fat signal. Uniformity of fat-sat with STIR depends on the $B_1$ homogeneity.

Hybrid approaches such as spectral pre-saturation with inversion recovery ("SPIR") and spectral attenuated inversion recovery ("SPAIR") use both the chemical-shift and $T_1$ differences between water and fat-protons for fat suppression. The SPIR sequence selectively excites the fat protons using 110 degree flip-angle RF pulse and saturates the fat signal using dephasing gradients. Flip-angle greater than 90 degrees provides effect similar to the inversion recovery. The SPAIR sequence is similar to STIR sequence, but the inversion is selective to fat-protons and is performed using a 180 degree adiabatic pulse. SPAIR has more signal-to-noise ratio than STIR as only the fat signal is inverted and is more uniform than the SPIR sequence because of the use of adiabatic pulse. However, the contrast between different tissues may be sub-optimal with SPAIR as compared to SPIR or CHESS methods.

Achieving uniform fat-sat throughout the anatomy of interest is important for clinical practice and the best method for fat-suppression depends on the anatomy and clinical need.

MR image intensity non-uniformity often observed at higher field strengths (3T and 7T) may impact diagnosis, quantification, and automation. Intensity non-uniformity is typically observed as hyper-intensities proximal to the receive and local transmit coils, and as hypo-intensities near the center of the field-of-view. The non-uniformity causes inhomogeneous appearance of the same tissue at different regions, and also effects the contrast between different tissues.

Intensity inhomogeneity in MRI is due to multiple factors including non-uniformity of the main magnetic field ($B_0$), transmit field ($B_1$), and receive (surface) coil-sensitivities. For example, inhomogeneous $B_0$ could cause insufficient suppression of fat (with sequences using spectral fat-sat) in regions with significant $B_0$ deviation causing differences in the "darkness" of fat at different regions of the anatomy. $B_1$ variation results in flip-angle inhomogeneity and the corresponding change in signal intensities across the anatomy. Surface coils cause inhomogeneous intensity due to quadratic dependence of their sensitivity on the distance of the region to the coil and also due to the dependence of sensitivity on the orientation of the coil to transverse magnetic field.

Various approaches for correcting the effect of receive coil-sensitivities have been proposed. Among these, methods that use a reference or calibration scan are used clinically more often for correcting the receive coil inhomogeneity. Methods that do not use a reference scan are not used as often due to inconsistent through-slice intensity profile and also due to their effect on quantification in scans, such as the dynamic contrast-enhanced ("DCE") MRI.

The efficacy of the reference scan-based methods may be affected by inconsistency in the spatial location between the reference images and the images that are corrected for non-uniformity. The low resolution of the reference scan may also reduce the sharpness of the edges in the corrected images. Additionally, the reference scan (often from the body coil) used for uniformity correction itself may be non-uniform at ultra-high-field strengths (e.g., as 7T), or may not be available in some scenarios.

Thus, there remains a need for a receive coil non-uniformity correction method that does not need a reference or calibration scan, and has consistent through-slice profile.

SUMMARY OF THE DISCLOSURE

The present disclosure addresses the aforementioned drawbacks by providing a method for generating an image with improved uniformity of a subject using a magnetic resonance imaging ("MRI") system.

In some configurations, a method is provided for generating an image of a subject using a magnetic resonance imaging (MRI) system. The method includes acquiring data from a subject using an MRI system that includes a multichannel receive coil having a plurality of different receive coils. The acquired data are reformatted as a four-dimensional ("4D") data set having three spatial dimensions and one dimension associated with a channel number of the multichannel receive coil. Cumulative coil sensitivity data are estimated from the 4D data set based on optimally combining data from the plurality of different receive coils and estimating coil sensitivity data for the plurality of different receive coils. An image of the subject is reconstructed from the acquired data using the cumulative coil sensitivity data, wherein the image has been corrected for non-uniformities in the multichannel receive coil based on the cumulative coil sensitivity data.

In some configurations, a system is provided for generating an image of a subject with improved uniformity. The system includes a magnetic resonance imaging (MRI) system configured to acquire data from a subject using a multichannel receive coil having a plurality of different receive coils. The system also includes a computer system configured to: i) reformat the acquired data as a four-dimensional (4D) data set having three spatial dimensions and one dimension associated with a channel number of the multichannel receive coil; ii) estimate cumulative coil sensitivity data from the 4D data set based on optimally combining data from the plurality of different receive coils and estimating coil sensitivity data for the plurality of different receive coils; and iii) reconstruct an image of the subject from the acquired data using the cumulative coil sensitivity data, where the image has been corrected for non-uniformities in the multichannel receive coil based on the cumulative coil sensitivity data.

In some configurations, a method is provided for generating an image of a subject with improved uniformity. The method includes determining a set of acquisition parameters for a magnetic resonance imaging (MRI) system and acquiring data using the MRI system with the determined acquisition parameters. A spectrum is generated depicting fat and water based on the acquired data, and the spectrum is assessed to determine a level of uniformity. The acquisition parameters are updated until a threshold level of uniformity has been achieved and updated data are acquired using the updated acquisition parameters. An image of the subject with improved uniformity may then be reconstructed from the updated data.

The foregoing and other aspects and advantages of the present disclosure will appear from the following description. In the description, reference is made to the accompanying drawings that form a part hereof, and in which there is shown by way of illustration a preferred embodiment. This embodiment does not necessarily represent the full scope of the invention, however, and reference is therefore made to the claims and herein for interpreting the scope of the invention.

DETAILED DESCRIPTION

Figure 1:
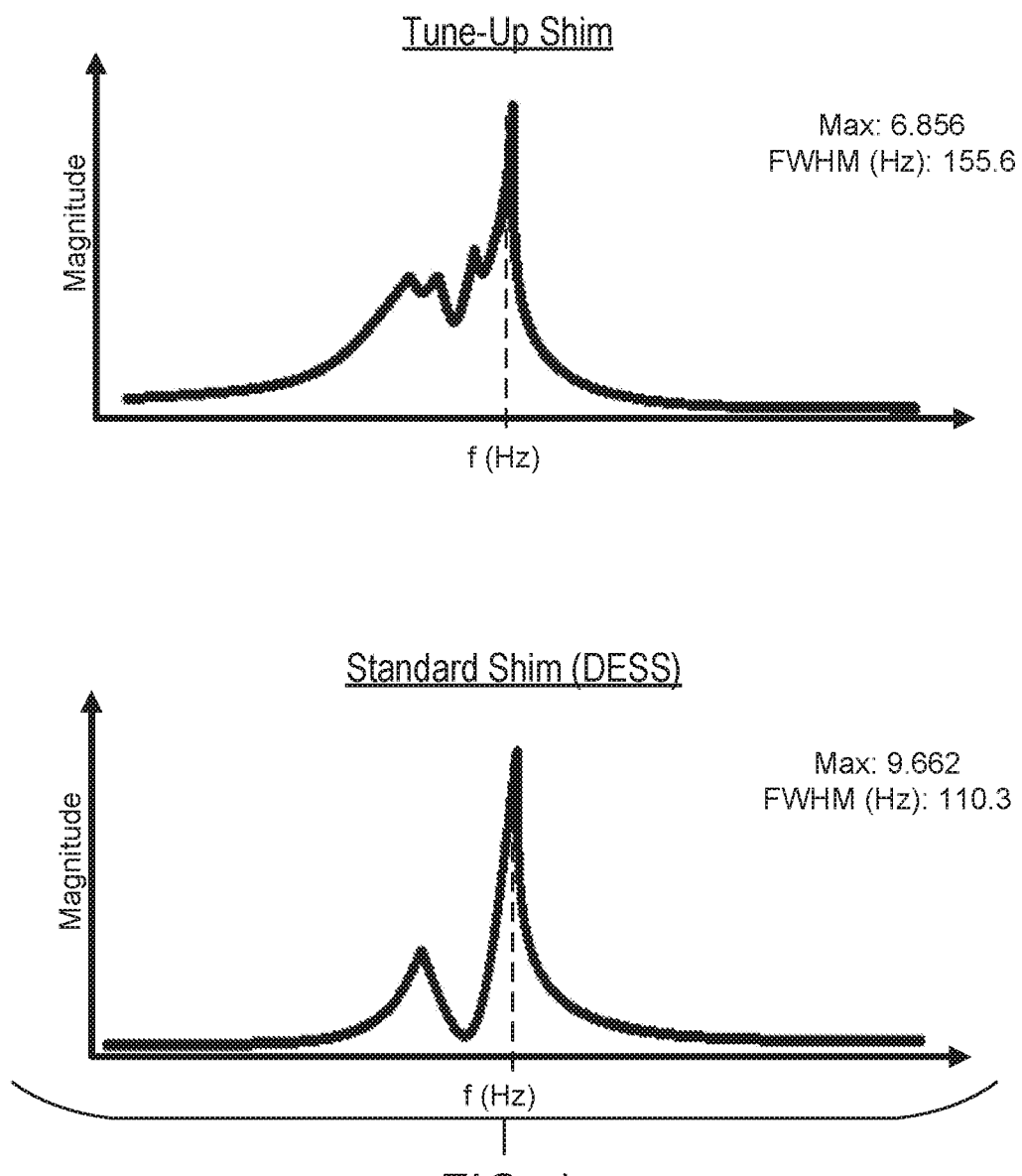
FIG. 1 shows that different full-width-at-half-maximum ("FWHM") for spectrum from the same subject can be observed with different shim options.

Described here are systems and methods for generating images with a magnetic resonance imaging ("MRI") system, in which the images have been corrected for receive coil non-uniformities. Improved data acquisition schemes are also described.

Some aspects of the present disclosure thus provide for a receive coil non-uniformity correction method. The methods described here have several advantages, including that they do not need a reference or calibration scan, provide a consistent through-slice profile, and provide improved sensitivity and uniformity compared to the results from state-of-the-art uniformity correction algorithms. An algorithm for uniform reconstruction of multichannel surface-coil data without use of a reference scan is advantageous for achieving clinically acceptable image quality on high field MRI systems (such as 7T MRI) that do not acquire a reference scan. The algorithm is also useful to improve image quality at 3T and other lower field strengths.

Some other aspects of the present disclosure provide for data acquisition schemes that provide an improvement in magnetic resonance image quality, fat saturation, and uniformity, which can be particularly advantageous for musculoskeletal ("MSK") imaging applications. The data acquisition schemes are independent of hardware considerations, such as the coils or other MRI scanner hardware.

Magnetic resonance image quality in general, and fat saturation in particular, is affected by multiple factors including static magnetic field, $B_0$; the dynamic transmit fields, $B_1$; gradient magnetic fields; pulse sequence; receive coil sensitivities; image resolution, image sharpness, or image blurriness; contrast between different tissues; reconstruction algorithms; post-processing; and noise, such as signal-to-noise ratio ("SNR") and contrast-to-noise ratio ("CNR"). The spectral complexity of fat is an additional and relevant factor to be considered for obtaining uniform fat saturation. In general, the fat spectrum has multiple peaks that can be observed at chemical-shift frequencies of −3.3 ppm, −2.5 ppm, +0.7 ppm, −3.7 ppm, −0.4 ppm, and −1.8 ppm relative to water. At 3T these peaks are at −420 Hz, −318 Hz, +94 Hz, −472 Hz, −46 Hz, and −234 Hz. Among these, two peaks (+0.7 ppm and −0.4 ppm) are relatively very close to the water peak, and saturating them with spectral fat-sat methods would also saturate some of water signal.

In the data acquisition schemes described in the present disclosure, the peaks at −420 Hz, −318 Hz, −472 Hz, and −234 Hz are considered in particular. Spectral fat-sat depends heavily on chemical separation of most of the water and fat signal and, hence, a robust $B_0$ (or shim) is important. Additionally, $B_1$ uniformity is also important for achieving the desired flip-angle uniformly throughout the anatomy. Even though factors such as receive coil sensitivity can affect the quality/uniformity of fat saturation, $B_0$ and $B_1$ are more important factors for the quality of spectral fat-sat.

The $B_0$ homogeneity is affected by the main magnet, transmit coil, and receive coil hardware; the shimming options used; and the anatomy or subject being scanned. Most modern magnets are very homogeneous with field variations less than 1 ppm. So, the anatomy being scanned is one of the more important factors affecting the $B_0$ homogeneity. For example, foot and ankle region and head and neck regions are known to create high $B_0$ inhomogeneity. The shimming options used is another contributor to homogeneity.

Referring now to FIG. 1, an example of variation in full-width-at-half-maximum ("FWHM") of the spectrum from the same subject with change in shim option is shown. A standard shim is used in the lower panel, while a tune-up shim is shown in the upper panel. In the non-limiting example data shown, the standard shim produced an FWHM of 110.3 Hz, while the tune-up shim produced 155.6 Hz for results.

Spectral fat-sat excites the fat protons selectively and saturates them. So, uniformity of the flip-angle throughout the anatomy-of-interest is important for the quality of fat-sat. Effects from $B_0$ and $B_1$ are not always mutually exclusive. For example, field inhomogeneity can result in variations of flip-angle depending on the bandwidth and frequency profile of the RF pulse used.

The data acquisition schemes described in the present disclosure can implement the following technical requirements to improve the overall image quality of fat-sat. In one aspect, the data acquisition schemes enable the flexibility to change fat-sat RF pulse type, RF offset, RF bandwidth, and time-bandwidth-product to improve fat-sat uniformity and SNR. In another aspect, the data acquisition schemes enable the flexibility to change the percentage of fat-sat through the change of fat-sat flip-angle. In another aspect, the data acquisition schemes provide an option to apply fat-sat pulses multiple times within the same repetition time ("TR") in order to improve fat-sat robustness to $B_1$ inhomogeneity. In another aspect, the data acquisition schemes provide an option to improve sharpness of the images using optimized RF excitation (90 degrees) pulse types with better slice profile. The data acquisition schemes described in the present disclosure can also enable reduced step-size for base resolution increments to have better control over the trade-off between SNR, scan-time, and resolution. The data acquisition schemes described in the present disclosure can also enable increased limit for the percent of phase-over-sampling for reducing aliasing artifacts in obese subjects.

As an example, the following RF pulse parameters can be selectively implemented with the data acquisition schemes described in the present disclosure. In general, a chemical-shift selective RF pulse can be used for suppression of lipid signals. In some embodiments, when prescribing the pulse sequence for data acquisition the user can be presented with a dropdown selection at the operator workstation of the MRI system to select between different RF pulse types for fat-sat. For example, Gauss, Sinc, Sinc_MSK, Sinc_Adv, and Int-HypSec (internally calculated hyperbolic secant for improved robustness against $B_1$ inhomogeneity) RF pulse types may be selected, in addition to others. The user may also select other parameters of the RF pulses.

In some instances, the RF pulse types have fixed RF duration, RF frequency off-set of fat with respect to water ("RFO"), bandwidth ("BW"), and time-bandwidth-product ("TBWP"). In other instances, some or all of these parameters may be selectively adjusted by the user, either freely or constrained to a selection of different available predefined options. In some instances, the parameters may be selected based on the spectrum of the water and fat protons. In some instances, the parameters may be selected depending on the anatomy being scanned. In one non-limiting example, knee and shoulder fat-sat exams could be optimized by using different choices for BW, RFO, and TBWP selected specifically for such knee or shoulder exams. In another non-limiting example, the parameters may be selected based on a fat-water spectrum measured from the specific subject in real-time. In another non-limiting example, the parameters may be selected based on the specific MRI scanner's shim uniformity characteristics or $B_0$ map of the subject. In another non-limiting example, the parameters may be selected based on the specific coils $B_1$ profile or $B_1$ map of the subject.

In one non-limiting example, flip-angle ("FA") for Sinc and Sinc_MSK can be fixed at 110 degrees when a "weak" fat-sat option is chosen, and can be dependent on the TR and number of slices when a "strong" fat-sat option is chosen (e.g., about 160 degrees for a typical clinical sequence).

For advanced RF pulse types, such as the Sinc_Adv and IntHypSec Rf pulses mentioned above, changes to RFO, BW, TBWP, and FA of the fat-sat RF pulse can be made. The RFO and BW can be provided in either ppm or Hz. If the Hz option is chosen, the Hz values of fat-sat pulse edge close to water and away from water can be taken as inputs to ease clinical workflow. Adiabatic RF pulse types (e.g., AD1 and AD2 in Table 1) options also allow changes to RFO and pulse duration. A summary of the various characteristics of the different pulse types is shown in Table 1.

TABLE 1

| Summary of the Characteristic of Example RF Pulse Types | | | | | | |
|---|---|---|---|---|---|---|
| | Gauss | Sin_MSK | Sinc_Adv | Int_Hypsec | AD1 | AD2 |
| Samples | 512 | 512 | 512 | 512 | 512 | 512 |
| Duration | 5.120 ms | 10.752 ms for 3 T and 21.504 ms for 1.5 T | Variable | variable | Variable | variable |
| Offset | −406.56 Hz (−3.3 ppm) | −418.88 Hz (−3.4 ppm) | variable | variable | Variable | variable |
| Bandwidth | 374.98 Hz (3.05 ppm) | 608.2 Hz (4.93 ppm) | variable | variable | NA | NA |

TABLE 1-continued

Summary of the Characteristic of Example RF Pulse Types

|  | Gauss | Sin_MSK | Sinc_Adv | Int_Hypsec | AD1 | AD2 |
|---|---|---|---|---|---|---|
| TBWP | 1.92 | 6.53 | variable | variable | NA | NA |
| Flip-angle | 110 (weak), and ~160 (strong) | 110 (weak), and ~160 (strong) | variable | variable | 180 | 180 |
| Initial Phase | 0 | 0 | 0 | 0 | 0 | 0 |
| Asymmetry | 0.5 | 0.5 | 0.5 | 0.5 | 0.5 | 0.5 |
| Family | GAUSS5120.B375 | F3DA.ALPHA_30A2_1 | NA | NA | SPIR.asymm_optfs_1_5T | SPIR.Optfs |

Figure 2A:
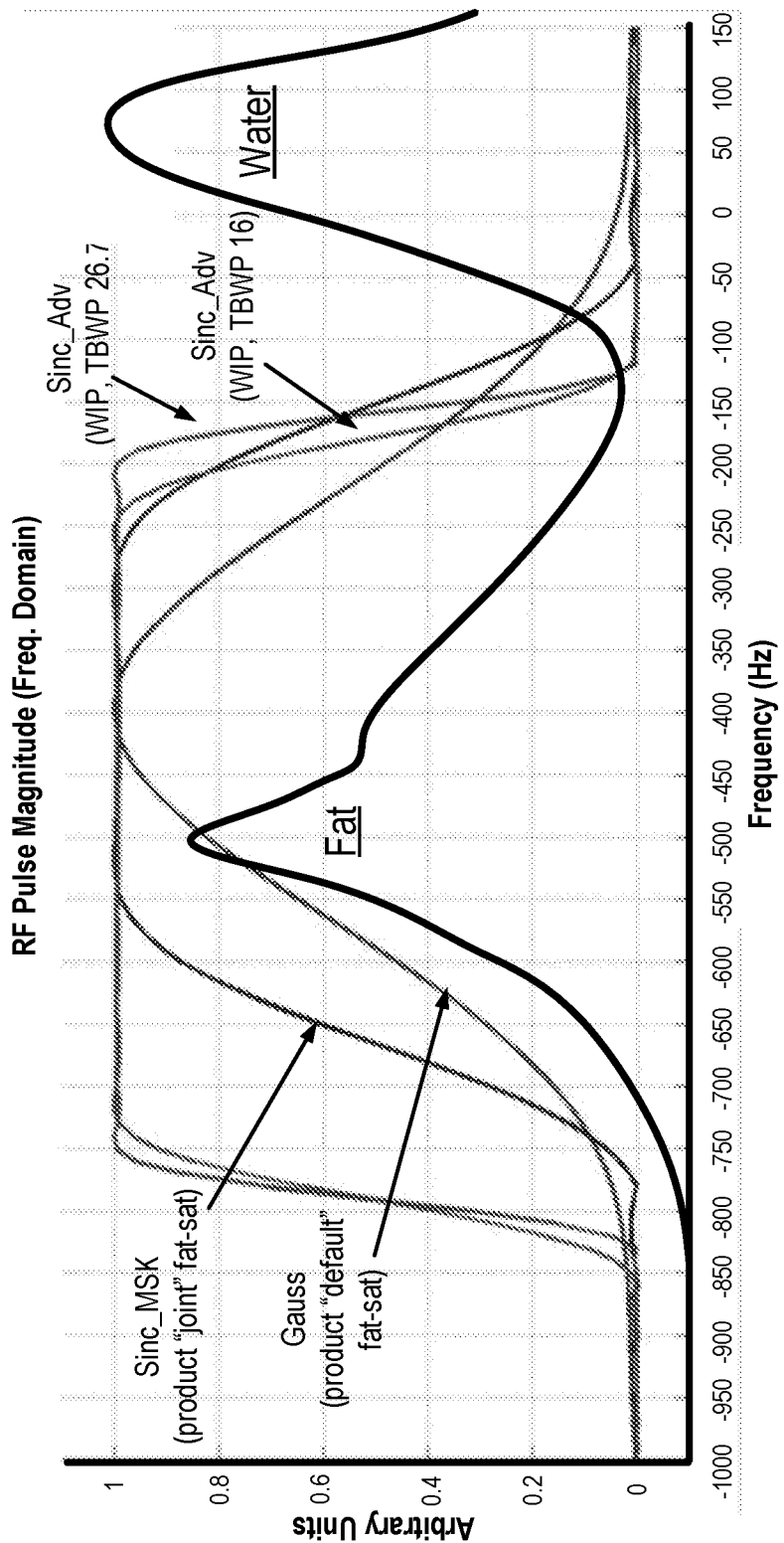
FIG. 2A shows a comparison of the frequency response of RF pulse types (Gauss, Sinc_MSK, and Sinc_Adv WIP with TBWP of 16 and 26.7), which shows improvement in frequency response of the fat-sat pulse with the WIP Sinc_Adv pulse. Gauss (product "default" fat-sat) and Sinc_MSK (product "joint" fat-sat) RF pulse durations are of 5.12 and 21.5 ms, whereas the WIP RF pulses durations for TBWP of 16 and 26.7 were 26.2 and 42.4 ms, respectively. Fat-sat Edge 1 and 2 with TBWP of 16 were −190 Hz and −800 Hz. Fat-sat Edge 1 and 2 with TBWP of 26.7 were −170 Hz and −800 Hz.

Referring now to FIG. 2A, non-limiting example frequency domain responses of the some RF pulse types are shown. It can be observed from the frequency domain shape of product pulses that as we move away from the offset frequency the suppression would be sub-optimal resulting in non-uniformity of fat-sat depending on the local $B_0$ field inhomogeneity.

Figure 2B:
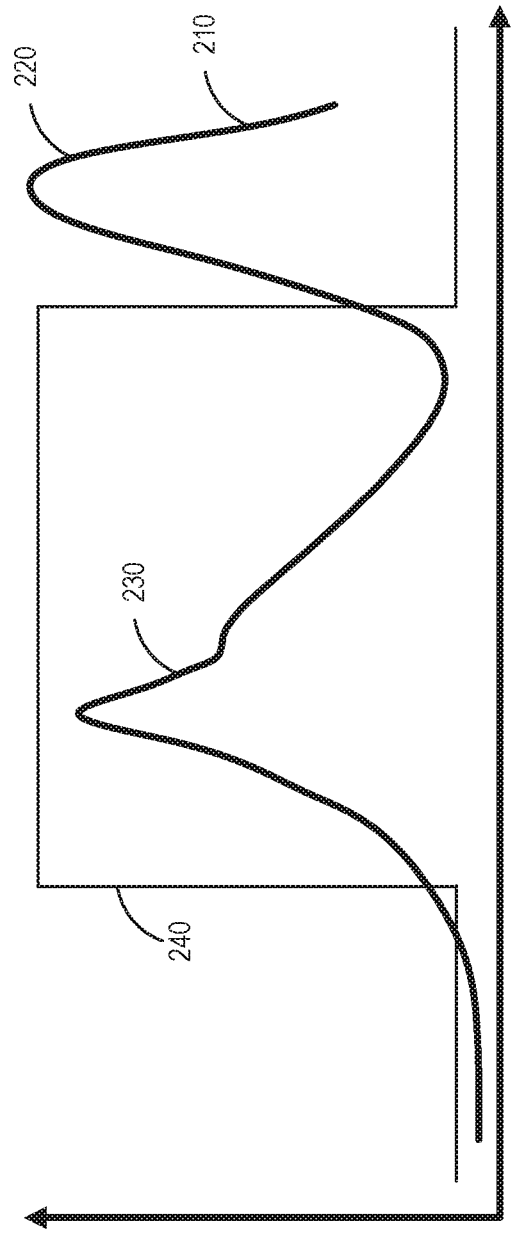
FIG. 2B a graph of a non-limiting example RF pulse profile with a symmetric profile is shown.

Referring now to FIG. 2B, a non-limiting example RF pulse profile 240 with a symmetric profile is shown. Fat-sat spectral profile 210 includes water peak 220 and fat peak 230. In some instances, the spectrum of water and fat may be assessed in real time during scanning and a user may change between symmetric and asymmetric fat-sat RF profiles. Switching to an asymmetric profile may be done to reduce the duration of fat-sat RF pulses for TR restricted sequences, such as $T_1$-weighted MRI. For the purposes of the present disclosure and accompanying claims, the term "real-time" or related terms are used to refer to and define a real-time performance of a system, which is understood as performance that is subject to operational deadlines from a given event to a system's response to that event. For example, real-time acquisition, processing, and/or displaying of data based on empirically-acquired signals may be triggered and/or executed simultaneously with or without interruption of a signal-acquisition procedure. Real-time may be defined as a clinical time scale where a process is completed on an order of time similar to performing a medical imaging scan.

Figure 2C:
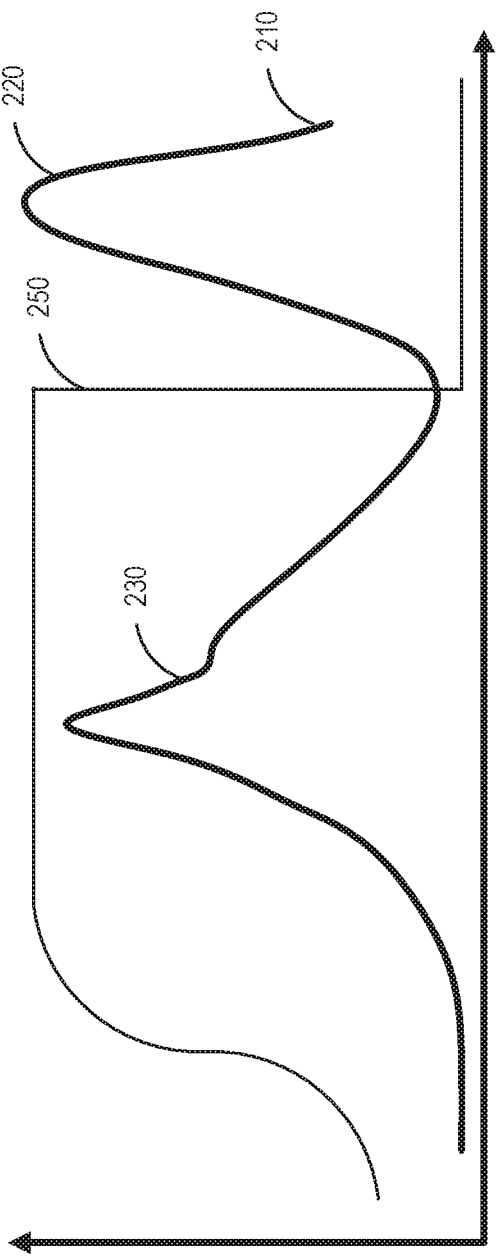
FIG. 2C a graph of a non-limiting example RF pulse profile with an asymmetric profile is shown.

Referring now to FIG. 2C, a non-limiting example RF pulse profile 250 with an asymmetric profile is shown. As in FIG. 2B, fat-sat spectral profile 210 includes water peak 220 and fat peak 230. Asymmetric RF pulse profile 250 may be used to exploit aspects of the asymmetric fat-sat spectral profile. In one non-limiting example, using wider bandwidth and a sharper asymmetric profile for fat-sat RF pulse profile 250 at the junction between the water peak 220 and fat peak 230 may allow for reducing the duration of fat-sat RF pulses for TR restricted sequences, such as T1 weighted MRI.

Figure 3:
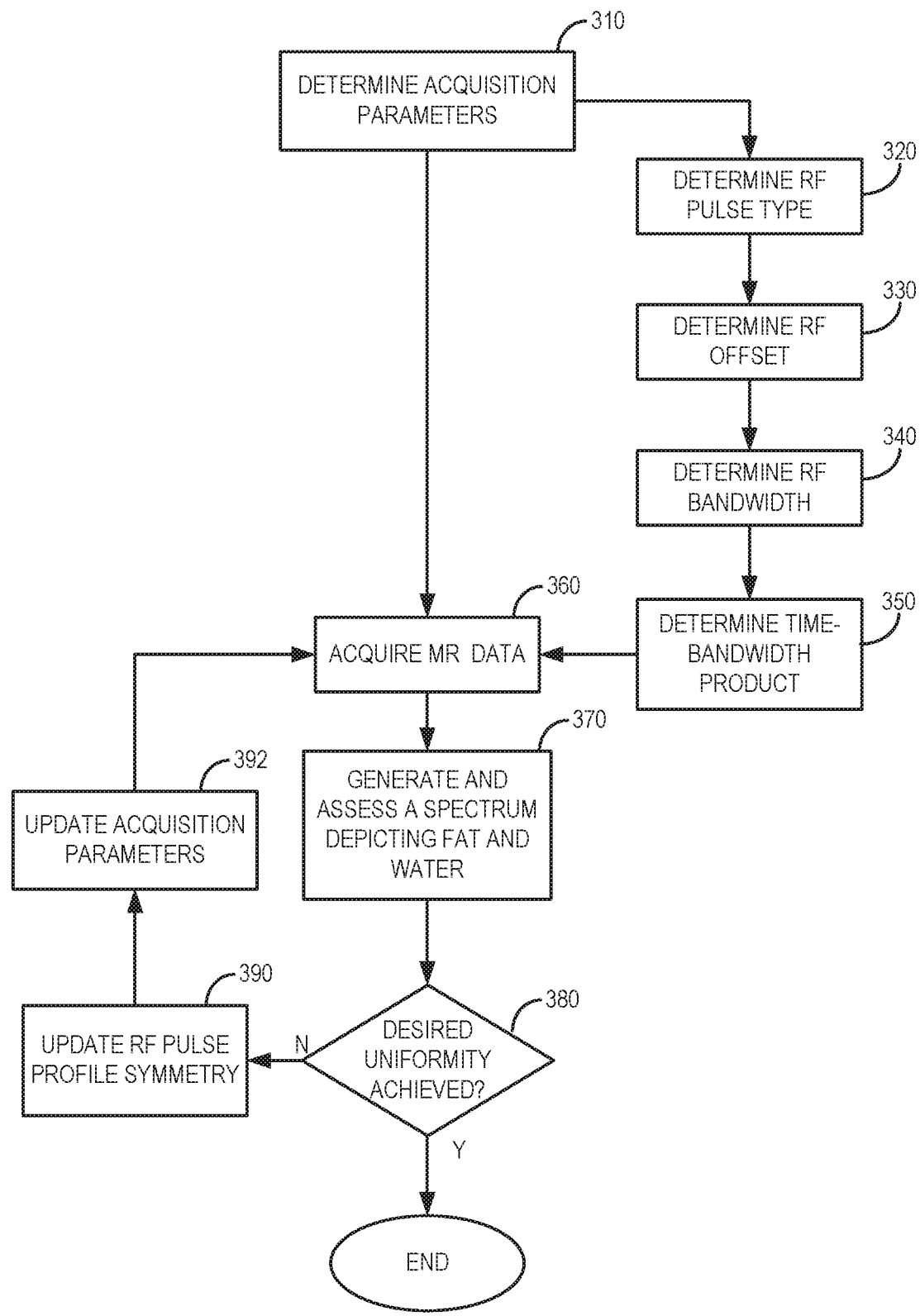
FIG. 3 is a flowchart setting forth non-limiting example steps of a method for acquiring magnetic resonance images that have reduced non-uniformities.

Referring to FIG. 3, a flowchart is illustrated as setting forth non-limiting example steps of a method for acquiring magnetic resonance data with reduced non-uniformities. The method includes determining acquisition parameters at step 310. Non-limiting example acquisition parameters may include RF pulse type, such as shown at step 320; RF offset, as shown at step 330; RF bandwidth, as shown at step 340; and time-bandwidth product, as shown at step 350. MR data are then acquired at step 360. A spectrum depicting fat and water is generated and an assessment of uniformity is performed at step 370. If a desired level of uniformity has been achieved, the process may end. If a desired level of uniformity has not been achieved, the RF pulse profile symmetry may be updated at step 390, such as by changing from a symmetric to an asymmetric pulse, or from an asymmetric pulse to a symmetric pulse. The acquisition parameters may also be updated at step 392 before MR data are acquired again with the updated parameters at step 360.

In some embodiments, assessing uniformity includes reconstructing an image associated with the fat and water spectrum data and evaluating the image by comparing intensities for pixels or voxels in the image. In some embodiments, the evaluation includes comparing image intensities in the superior with inferior regions, anterior with posterior regions, and/or left with right regions. Uniformity evaluation may also be performed by comparing the image intensities adjacent to the coil with intensities near the center of the field of view (FOV). A threshold level of uniformity may be used to determine if a desired level of uniformity has been achieved.

In addition to the data acquisition schemes described above, improved uniformity can be provided by performing non-uniformity correction. In the methods described in the present disclosure, the non-uniformity created by a receive coil or surface coil is assumed to be multiplicative. Additionally, the non-uniformity of the local receive coil can be assumed to be of low spatial frequency. As noted, using the methods described in the present disclosure, no reference scan is needed. Rather, the coil-sensitivities are estimated from the multichannel data and decoupled to obtain a uniform image or image volume. The uniformity correction is performed on the whole volume together by creating a 4D data set (i.e., 3 spatial dimensions and 1 channel dimension) using channel information from all the slices of the volume. This provides for a consistent through slice profile. The sensitivity is enhanced by using the cumulative coil sensitivity, which provides better sensitivity and uniformity compared to the state-of-the-art uniformity correction algorithms.

Figure 4:
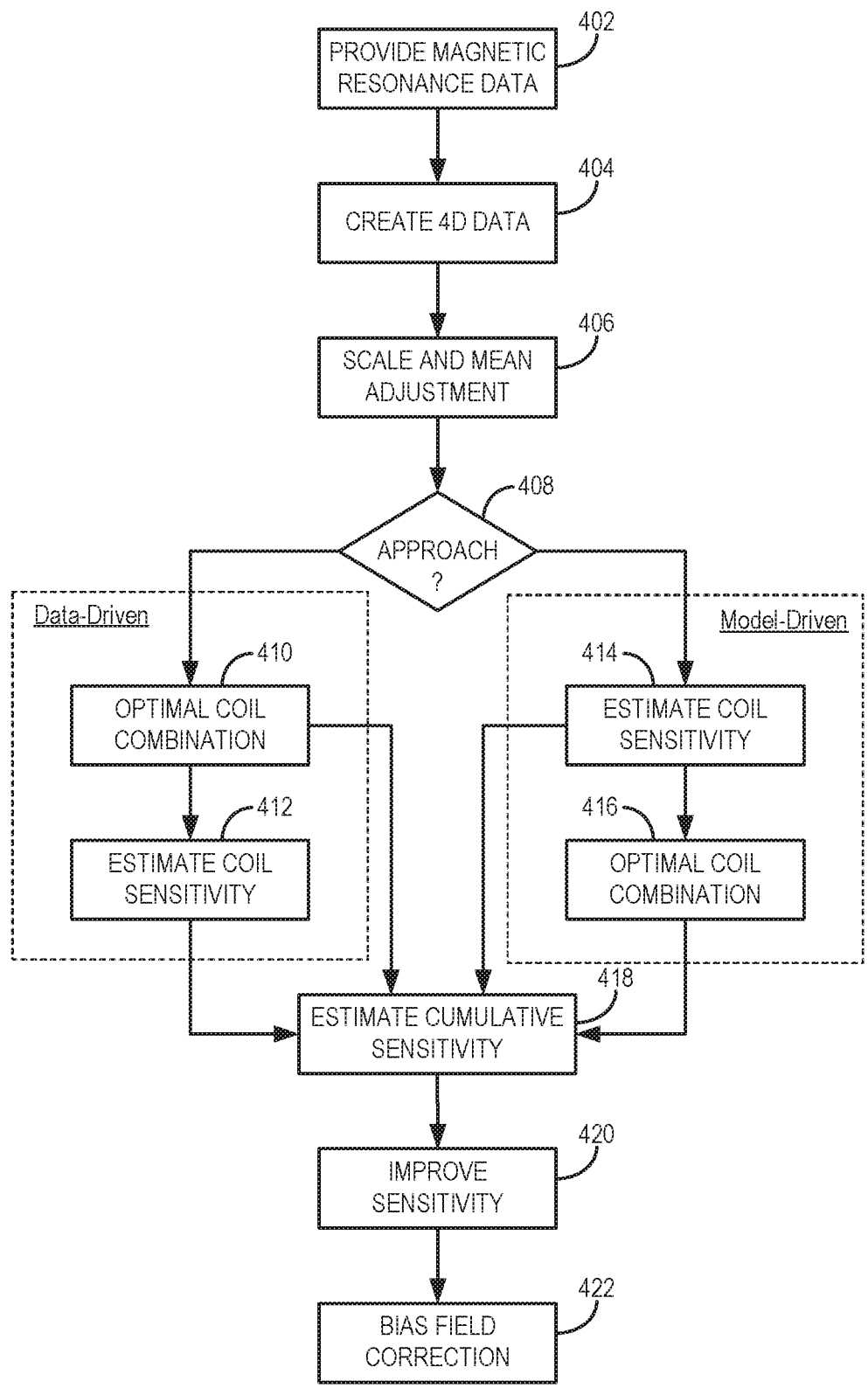
FIG. 4 is a flowchart setting forth non-limiting example steps of a method for generating non-uniformity corrected images using magnetic resonance imaging ("MRI").

Referring now to FIG. 4, a flowchart is illustrated as setting forth the steps of an example method for generating magnetic resonance images that have been corrected for receive coil non-uniformities. The method includes providing magnetic resonance data to a computer system, as indicated at step 402. The magnetic resonance data can be provided to the computer system be retrieving previously acquired data from a memory or data storage, or by acquiring the data with an MRI system and transmitting the data to the computer system, which may form a part of the MRI system. In general, the magnetic resonance data are acquired from a subject using a multichannel receive coil (e.g., an array of receive coils, which may be a phased array). The magnetic resonance data are acquired from a plurality of slices spanning an image volume. As described above, in some implementations the magnetic resonance data can be acquired using data acquisition schemes that are optimized for more uniform fat-saturation and improved image quality.

A 4D data set is generated from the magnetic resonance data using the channel information from all of the slices of the volume, as indicated at step 404. As noted above, the 4D data includes data formatted in three spatial dimension and one coil channel dimension. Thus, as an example, the 4D data set can be generated by reformatting the magnetic resonance data for each slice (three spatial dimensions) for each coil channel.

The individual coil data in the 4D data set are then scaled and the mean of the individual coil data adjusted, as indicated at step 406. A determination is then made at decision block 408 whether a data-driven approach or a model-driven approach to the non-uniformity correction should be implemented. In the data-driven approach, the individual coil data are first combined at step 410 and then coil sensitivity data are estimated at step 412 based on the optimal combination of channels. In the model-driven approach, the coil sensitivity data are estimated first at step 414 and then the individual coil data are combined at step 416. As one example, optimal combination of the coil data can be performed using a singular-value decomposition ("SVD").

Cumulative coil sensitivity is then computed over the volume based at least in part on the estimated coil sensitivity data, as indicated at step 418. The sensitivity data are then enhanced using the cumulative coil sensitivity, as indicated at step 420. Residual intensity inhomogeneities (e.g., those resulting from factors such as $B_1$) are corrected, as Indicated at step 422. As one example, the residual intensity inhomogeneities can be corrected using a bias-field correction method.

In some embodiments, the procedure for estimating coil sensitivities can be implemented as follows. At a given location (i,j,k) in a 3D volume, the non-uniformity of signal of surface coil can be modeled using a polynomial dependent on the location indices (i,j,k), such as, $$C_n(i,j,k) = M(i,j,k)[a_{0n} + a_{1n}i + a_{2n}i^2 + a_{3n}j + a_{4n}j^2 + a_{5n}k + a_{6n}k^2 + \ldots] \quad (1);$$

where $C_n(i,j,k)$ is the signal measured from location (i,j,k) by the nth surface coil and $M(i,j,k)$ is the "true" intensity of the voxel. If the MRI system acquires the data with N receive coils, then a matrix equation for the multichannel data for a single voxel can be written as, $$\begin{bmatrix} C_1(i,j,k) \\ C_2(i,j,k) \\ \vdots \\ C_n(i,j,k) \\ \vdots \\ C_N(i,j,k) \end{bmatrix}^T = M(i,j,k)[1 \quad i \quad i^2 \quad j \quad j^2 \quad k \quad k^2 \quad \ldots]A; \quad (2)$$

where, $$A = \begin{bmatrix} a_{01} & a_{02} & \ldots & a_{0n} & \ldots & a_{0N} \\ a_{11} & a_{12} & \ldots & a_{1n} & \ldots & a_{1N} \\ a_{21} & a_{22} & \ldots & a_{2n} & \ldots & a_{2N} \\ \vdots & \vdots & \ldots & \vdots & \ldots & \vdots \\ a_{m1} & a_{m2} & \ldots & a_{mn} & \ldots & a_{mN} \\ \vdots & \vdots & \ldots & \vdots & \ldots & \vdots \\ a_{M1} & a_{M2} & \ldots & a_{Mn} & \ldots & a_{MN} \end{bmatrix}; \quad (3)$$

is an (M+1)×N matrix. In Eqn (2), there are N measurements and ((M+1)×N)+1 unknowns. The unknown M(i,j,k) Is the primary unknown of interest, and $a_{mn}$ are the ((M+1)×N)N unknowns related to the polynomial modeled coil sensitivity, where m goes from 0 to M and n goes from 1 to N.

If the image volume has a size of P×Q×R, then the multichannel data for the complete volume can be written in the following matrix format:

$$Y = DBA \quad (4);$$

where $$Y = \begin{bmatrix} C_1(1,1,1) & C_2(1,1,1) & \ldots & C_n(1,1,1) & \ldots & C_N(1,1,1) \\ \vdots & \vdots & \ldots & \vdots & \ldots & \vdots \\ C_1(i,j,k) & C_2(i,j,k) & \ldots & C_n(i,j,k) & \ldots & C_N(i,j,k) \\ \vdots & \vdots & \ldots & \vdots & \ldots & \vdots \\ C_1(P,Q,R) & C_2(P,Q,R) & \ldots & C_n(P,Q,R) & \ldots & C_N(P,Q,R) \end{bmatrix}; \quad (5)$$

is the matrix representation of the multichannel coil data and has a size of $N_{vox} \times N$ with $N_{vox} = PQR$, $$D = \begin{bmatrix} M(1,1,1) & 0 & \ldots & 0 & 0 \\ 0 & \ddots & & & 0 \\ \vdots & & M(i,j,k) & & \vdots \\ 0 & & & \ddots & 0 \\ 0 & 0 & \ldots & 0 & M(P,Q,R) \end{bmatrix}; \quad (6)$$

is a diagonal matrix of size $N_{vox} \times N_{vox}$ with the "true" magnetic resonance signal intensities as the diagonal entries, and $$B = \begin{bmatrix} 1 & 1 & 1 & 1 & 1 & 1 & 1 & \ldots \\ \vdots & \vdots & \vdots & \vdots & \vdots & \vdots & \vdots & \ldots \\ 1 & i & i^2 & j & j^2 & k & k^2 & \ldots \\ \vdots & \vdots & \vdots & \vdots & \vdots & \vdots & \vdots & \ldots \\ 1 & P & P^2 & Q & Q^2 & R & R^2 & \ldots \end{bmatrix}; \quad (7)$$

is a matrix of size $N_{vox} \times (M+1)$ with known entries depending only the spatial location of the voxel. In Eqn. (4), there are $N_{vox}N$ measurements and $MN+M+N_{vox}$ unknowns. Multiplying Y with its transpose results in, $$Y^T Y = (BA)^T(D^T D)(BA) \quad (8);$$

where $Y^T Y$ has size N×N, $D^T D$ has size $N_{vox} \times N_{vox}$, and BA has size $N_{vox} \times N$. Each column of the matrix BA, which has a length of $N_{vox}$ when rearranged to a volume of size PQR, represents the coil sensitivity map for the corresponding channel.

The matrices for A and D can be iteratively solved. In some implementations, the solution for singular-value decomposition ("SVD") can be used as an initial guess. Alternatively, the problem can be solved analytically. As one example, the problem can be solved analytically as follows. First, a log of the images from each receive coil is computed and the log of the polynomial is approximated with another polynomial, such as, $$lC_n(i,j,k) = lM(i,j,k) + la_{mn} \quad (9);$$

where $lC_n(i,j,k)$ is the log of $C_n(i,j,k)$, $lM(i,j,k)$ is the log of $M(i,j,k)$, and, $$la_{mn} = la_{0n} + la_{1n}i + la_{2n}i^2 + la_{3n}j + la_{4n}j^2 + la_{5n}k + la_{6n}k^2 + \quad (10);$$

are the coefficients used to represent the channel scaling in the log domain.

An average of all the receive coil measurements is computed and subtracted from the individual coil intensities to obtain an equation independent of lM(i,j,k), $$lC_n(i,j,k) - \sum_{n=1}^{N} \frac{lC_n(i,j,k)}{N} = la_{mn} - \frac{1}{N}\sum_{n=1}^{N} la_{mn}. \quad (11)$$

With the following definition:

$$la_{mn} - \frac{1}{N}\sum_{n=1}^{N} la_{mn} = l_{mn}; \quad (12)$$

then the matrix representation of the log coil sensitivity for the multichannel data can be estimated as the following when extended to all voxels:

$$C = BL \quad (13);$$

where $$C = \begin{bmatrix} lC_1(i,j,k) \\ lC_2(i,j,k) \\ \vdots \\ lC_n(i,j,k) \\ \vdots \\ lC_N(i,j,k) \end{bmatrix}^T - \sum_{n=1}^{N} \frac{lC_n(i,j,k)}{N}[1 \;\; 1 \;\; \ldots \;\; 1]; \quad (14)$$

$$L = \begin{bmatrix} l_{01} & l_{02} & \ldots & l_{0n} & \ldots & l_{0N} \\ l_{11} & l_{12} & \ldots & l_{1n} & \ldots & l_{1N} \\ l_{21} & l_{22} & \ldots & l_{2n} & \ldots & l_{2N} \\ l_{31} & l_{32} & \ldots & l_{3n} & \ldots & l_{3N} \\ l_{41} & l_{42} & \ldots & l_{4n} & \ldots & l_{4N} \\ l_{51} & l_{52} & \ldots & l_{5n} & \ldots & l_{5N} \\ l_{61} & l_{62} & \ldots & l_{6n} & \ldots & l_{6N} \end{bmatrix}; \quad (15)$$

and where, $$L = (B^T B)^{-1} B^T C \quad (16).$$

Once L is obtained, $l_{mn}$ can be determined, which can then be used to determine $la_{mn}$ as, $$l_{mn} = la_{mn} - \frac{1}{N}[la_{m1} \; la_{m2} \; \ldots \; la_{mn} \; \ldots \; la_{mN}][1 \; 1 \; \ldots \; 1 \; \ldots \; 1]^T \quad (17)$$

$$[l_{m1} \; l_{m2} \; \ldots \; l_{mn} \; \ldots \; l_{mN}] = [la_{m1} \; la_{m2} \; \ldots \; la_{mn} \; \ldots \; la_{mN}] - \frac{1}{N}[la_{m1} \; la_{m2} \; \ldots \; la_{mn} \; \ldots \; la_{mN}]O;$$

$$\begin{bmatrix} l_{01} & l_{02} & \ldots & l_{0n} & \ldots & l_{0N} \\ l_{11} & l_{12} & \ldots & l_{1n} & \ldots & l_{1N} \\ \vdots & \vdots & \ldots & \vdots & \ldots & \vdots \\ l_{m1} & l_{m2} & \ldots & l_{mn} & \ldots & l_{mN} \\ \vdots & \vdots & \ldots & \vdots & \ldots & \vdots \\ l_{M1} & l_{M2} & \ldots & l_{Mn} & \ldots & l_{MN} \end{bmatrix} = \quad (18)$$

$$\begin{bmatrix} la_{01} & la_{02} & \ldots & la_{0n} & \ldots & la_{0N} \\ la_{11} & la_{12} & \ldots & la_{1n} & \ldots & la_{1N} \\ \vdots & \vdots & \ldots & \vdots & \ldots & \vdots \\ la_{m1} & la_{m2} & \ldots & la_{mn} & \ldots & la_{mN} \\ \vdots & \vdots & \ldots & \vdots & \ldots & \vdots \\ la_{M1} & la_{M2} & \ldots & la_{Mn} & \ldots & la_{MN} \end{bmatrix} [I - O];$$

$$L = A[I - O] \quad (19)$$
$$L = AE$$
$$A = LE^T(EE^T)^{-1}.$$

Once A is known, then lM(i,j,k) can be estimated from Eqn. (9) to determine M(i,j,k), the non-uniformity corrected MRI voxel intensity.

Algorithms for correcting the intensity non-uniformity in MR images have thus been described. The algorithms described in the present disclosure can provide better sensitivity in anatomical regions where non-uniform signal intensities are commonly encountered (e.g., inferior regions of the knee) compared to state-of-the art inhomogeneity correction filters. Image contrast, another critical factor for image quality, is not adversely affected with use of the methods of the present disclosure to increase uniformity. The methods of the present disclosure may enhance spatial frequencies in the coil-combined images and decouple coil-induced inhomogeneity, thus improving both intertissue contrast and intratissue uniformity, simultaneously.

Figure 5:
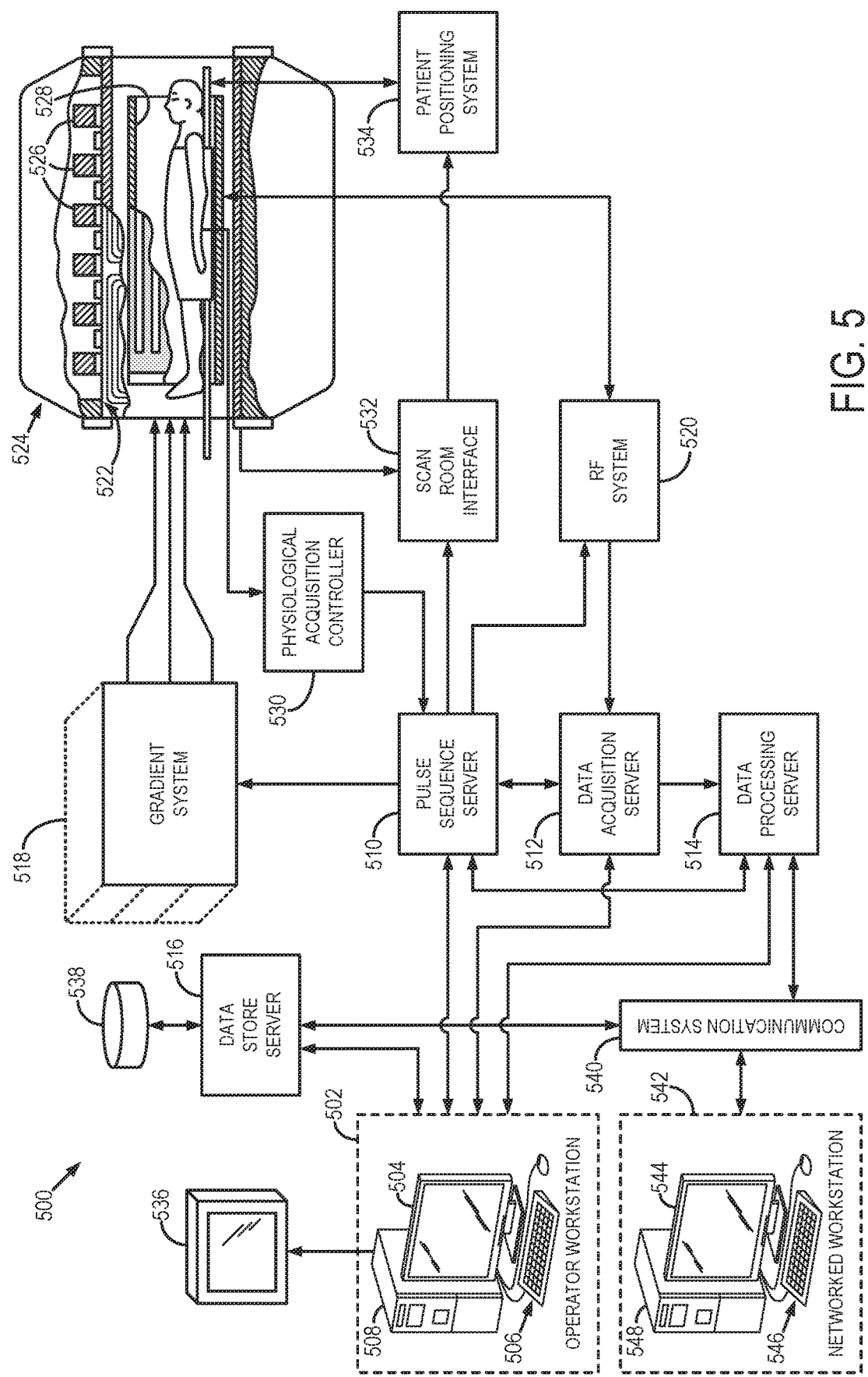
FIG. 5 is a block diagram of an example MRI system that can implement the methods described in the present disclosure.

Referring particularly now to FIG. 5, an example of an MRI system 500 that can implement the methods described here is illustrated. The MRI system 500 includes an operator workstation 502 that may include a display 504, one or more input devices 506 (e.g., a keyboard, a mouse), and a processor 508. The processor 508 may include a commercially available programmable machine running a commercially available operating system. The operator workstation 502 provides an operator interface that facilitates entering scan parameters into the MRI system 500. The operator workstation 502 may be coupled to different servers, including, for example, a pulse sequence server 510, a data acquisition server 512, a data processing server 514, and a data store server 516. The operator workstation 502 and the servers 510, 512, 514, and 516 may be connected via a communication system 540, which may include wired or wireless network connections.

The pulse sequence server 510 functions in response to instructions provided by the operator workstation 502 to operate a gradient system 518 and a radiofrequency ("RF") system 520. Gradient waveforms for performing a prescribed scan are produced and applied to the gradient system 518, which then excites gradient coils in an assembly 522 to produce the magnetic field gradients $G_x$, $G_y$, and $G_z$ that are used for spatially encoding magnetic resonance signals. The gradient coil assembly 522 forms part of a magnet assembly 524 that includes a polarizing magnet 526 and a whole-body RF coil 528.

RF waveforms are applied by the RF system 520 to the RF coil 528, or a separate local coil to perform the prescribed magnetic resonance pulse sequence. Responsive magnetic resonance signals detected by the RF coil 528, or a separate local coil, are received by the RF system 520. The responsive magnetic resonance signals may be amplified, demodulated, filtered, and digitized under direction of commands produced by the pulse sequence server 510. The RF system 520 includes an RF transmitter for producing a wide variety of RF pulses used in MRI pulse sequences. The RF transmitter is responsive to the prescribed scan and direction from the pulse sequence server 510 to produce RF pulses of the desired frequency, phase, and pulse amplitude waveform. The generated RF pulses may be applied to the whole-body RF coil 528 or to one or more local coils or coil arrays.

The RF system 520 also includes one or more RF receiver channels. An RF receiver channel includes an RF preamplifier that amplifies the magnetic resonance signal received by the coil 528 to which it is connected, and a detector that detects and digitizes the I and Q quadrature components of the received magnetic resonance signal. The magnitude of the received magnetic resonance signal may, therefore, be determined at a sampled point by the square root of the sum of the squares of the and Q components:

$$M = \sqrt{I^2 + Q^2} \quad (20);$$

and the phase of the received magnetic resonance signal may also be determined according to the following relationship:

$$\varphi = \tan^{-1}\left(\frac{Q}{I}\right). \quad (21)$$

The pulse sequence server 510 may receive patient data from a physiological acquisition controller 530. Byway of example, the physiological acquisition controller 530 may receive signals from a number of different sensors connected to the patient, including electrocardiograph ("ECG") signals from electrodes, or respiratory signals from a respiratory bellows or other respiratory monitoring devices. These signals may be used by the pulse sequence server 510 to synchronize, or "gate," the performance of the scan with the subject's heart beat or respiration.

The pulse sequence server 510 may also connect to a scan room interface circuit 532 that receives signals from various sensors associated with the condition of the patient and the magnet system. Through the scan room interface circuit 532, a patient positioning system 534 can receive commands to move the patient to desired positions during the scan.

The digitized magnetic resonance signal samples produced by the RF system 520 are received by the data acquisition server 512. The data acquisition server 512 operates in response to instructions downloaded from the operator workstation 502 to receive the real-time magnetic resonance data and provide buffer storage, so that data is not lost by data overrun. In some scans, the data acquisition server 512 passes the acquired magnetic resonance data to the data processor server 514. In scans that require information derived from acquired magnetic resonance data to control the further performance of the scan, the data acquisition server 512 may be programmed to produce such information and convey it to the pulse sequence server 510. For example, during pre-scans, magnetic resonance data may be acquired and used to calibrate the pulse sequence performed by the pulse sequence server 510. As another example, navigator signals may be acquired and used to adjust the operating parameters of the RF system 520 or the gradient system 518, or to control the view order in which k-space is sampled. In still another example, the data acquisition server 512 may also process magnetic resonance signals used to detect the arrival of a contrast agent in a magnetic resonance angiography ("MRA") scan. For example, the data acquisition server 512 may acquire magnetic resonance data and processes it in real-time to produce information that is used to control the scan.

The data processing server 514 receives magnetic resonance data from the data acquisition server 512 and processes the magnetic resonance data in accordance with instructions provided by the operator workstation 502. Such processing may include, for example, reconstructing two-dimensional or three-dimensional images by performing a Fourier transformation of raw k-space data, performing other image reconstruction algorithms (e.g., iterative or backprojection reconstruction algorithms), applying filters to raw k-space data or to reconstructed images, generating functional magnetic resonance images, or calculating motion or flow images.

Images reconstructed by the data processing server 514 are conveyed back to the operator workstation 502 for storage. Real-time images may be stored in a data base memory cache, from which they may be output to operator display 502 or a display 536. Batch mode images or selected real time images may be stored in a host database on disc storage 538. When such images have been reconstructed and transferred to storage, the data processing server 514 may notify the data store server 516 on the operator workstation 502. The operator workstation 502 may be used by an operator to archive the images, produce films, or send the images via a network to other facilities.

The MRI system 500 may also include one or more networked workstations 542. For example, a networked workstation 542 may include a display 544, one or more input devices 546 (e.g., a keyboard, a mouse), and a processor 548. The networked workstation 542 may be located within the same facility as the operator workstation 502, or In a different facility, such as a different healthcare institution or clinic.

The networked workstation 542 may gain remote access to the data processing server 514 or data store server 516 via the communication system 540. Accordingly, multiple networked workstations 542 may have access to the data processing server 514 and the data store server 516. In this manner, magnetic resonance data, reconstructed images, or other data may be exchanged between the data processing server 514 or the data store server 516 and the networked workstations 542, such that the data or images may be remotely processed by a networked workstation 542.

The present disclosure has described one or more preferred embodiments, and it should be appreciated that many equivalents, alternatives, variations, and modifications, aside from those expressly stated, are possible and within the scope of the invention.

The invention claimed is:

1. A method for generating an image of a subject using a magnetic resonance imaging (MRI) system, the steps of the method comprising:
    (a) acquiring data from a subject using an MRI system that includes a multichannel receive coil having a plurality of different receive coils;

(b) reformatting the acquired data as a four-dimensional (4D) data set having three spatial dimensions and one dimension associated with a channel number of the multichannel receive coil;

(c) estimating cumulative coil sensitivity data from the 4D data set based on optimally combining data from the plurality of different receive coils and estimating coil sensitivity data for the plurality of different receive coils; and (d) reconstructing an image of the subject from the acquired data using the cumulative coil sensitivity data, wherein the image has been corrected for non-uniformities in the multichannel receive coil based on the cumulative coil sensitivity data.

2. The method as recited in claim 1, wherein step (c) implements a data-driven approach in which the data from the plurality of different receive coils is optimally combined and the coil sensitivity data are estimated from the combined data.

3. The method as recited in claim 1, wherein step (c) implements a model-driven approach in which the coil sensitivity data are individually estimated from the plurality of different receive coils before optimally combining the estimated coil sensitivity data for the plurality of different receive coils.

4. The method as recited in claim 1, wherein the optimally combining the data in step (c) can be performed using a singular-value decomposition (SVD).

5. The method as recited in claim 1, wherein the cumulative coil sensitivity data can be computed based on modeling the multichannel receive coil non-uniformity using a polynomial dependent on spatial location indices.

6. The method as recited in claim 1, wherein the cumulative coil sensitivity data can be iteratively estimated from the acquired data and the estimated coil sensitivity data.

7. The method as recited in claim 1, wherein the cumulative coil sensitivity data can be analytically estimated from the acquired data and the estimated coil sensitivity data based on computing logarithms of the estimated coil sensitivity data.

8. The method as recited in claim 1, wherein the data are acquired using a pulse sequence that has been optimized to improve fat saturation uniformity.

9. The method as recited in claim 8, wherein the pulse sequence is optimized based on a selection of one or more RF parameters comprising RF pulse type, RF pulse duration, RF frequency off-set of fat with respect to water ("RFO"), bandwidth ("BW"), and time-bandwidth-product ("TBWP").

10. A system for generating an image of a subject with improved uniformity, the system comprising:
a magnetic resonance imaging (MRI) system configured to acquire data from a subject using a multichannel receive coil having a plurality of different receive coils;
a computer system configured to:
(i) reformat the acquired data as a four-dimensional (4D) data set having three spatial dimensions and one dimension associated with a channel number of the multichannel receive coil;
(ii) estimate cumulative coil sensitivity data from the 4D data set based on optimally combining data from the plurality of different receive coils and estimating coil sensitivity data for the plurality of different receive coils; and
(iii) reconstruct an image of the subject from the acquired data using the cumulative coil sensitivity data, wherein the image has been corrected for non-uniformities in the multichannel receive coil based on the cumulative coil sensitivity data.

11. The system as recited in claim 10, wherein the computer system implements a data-driven approach in which the data from the plurality of different receive coils is optimally combined and the coil sensitivity data are estimated from the combined data.

12. The system as recited in claim 10, wherein the computer system implements a model-driven approach in which the coil sensitivity data are individually estimated from the plurality of different receive coils before optimally combining the estimated coil sensitivity data for the plurality of different receive coils.

13. The system as recited in claim 10, wherein the optimally combining the data can be performed using a singular-value decomposition (SVD).

14. The system as recited in claim 10, wherein the cumulative coil sensitivity data can be computed based on modeling the multichannel receive coil non-uniformity using a polynomial dependent on spatial location indices.

15. The system as recited in claim 10, wherein the cumulative coil sensitivity data can be iteratively estimated from the acquired data and the estimated coil sensitivity data.

16. The system as recited in claim 10, wherein the cumulative coil sensitivity data can be analytically estimated from the acquired data and the estimated coil sensitivity data based on computing logarithms of the estimated coil sensitivity data.

17. The system as recited in claim 10, wherein the data are acquired using the magnetic resonance imaging system with a pulse sequence that has been optimized to improve fat saturation uniformity.

18. The system as recited in claim 17, wherein the pulse sequence is optimized based on a selection of one or more RF parameters comprising RF pulse type, RF pulse duration, RF frequency off-set of fat with respect to water ("RFO"), bandwidth ("BW"), and time-bandwidth-product ("TBWP").

19. A method for generating an image of a subject with improved uniformity, the method comprising:
a) determining a set of acquisition parameters for a magnetic resonance imaging (MRI) system;
b) acquiring data using the MRI system with the determined acquisition parameters;
c) generating a spectrum depicting fat and water based on the acquired data;
d) assessing a level of uniformity based on the generated spectrum;
e) updating the acquisition parameters until a threshold level of uniformity has been achieved and acquiring updated data using the updated acquisition parameters; and
f) reconstructing the image of the subject with improved uniformity from the updated data.

20. The method of claim 19, wherein the acquisition parameters are radio frequency (RF) parameters including at least one of: RF pulse type, RF pulse duration, RF frequency off-set of fat with respect to water ("RFO"), bandwidth ("BW"), and time-bandwidth-product ("TBWP").

21. The method of claim 19, wherein determining acquisition parameters includes determining a symmetry of an RF pulse profile, and wherein acquiring data includes using the determined RF pulse profile.

22. The method of claim 21, wherein the RF pulse profile is asymmetric.

23. The method of claim 22, wherein the asymmetric RF pulse profile includes an edge between a water peak and a fat peak in the generated spectrum depicting fat and water.

24. The method of claim 21, further comprising updating the acquisition parameters with the determined RF pulse profile when a threshold level of uniformity has not been achieved and acquiring updated data using the updated acquisition parameters.

25. The method of claim 24, wherein updating the acquisition parameters includes updating a symmetric RF pulse profile with an asymmetric RF pulse profile.

26. The method of claim 19, wherein assessing a level of uniformity includes determining if a threshold level of uniformity has been achieved in the reconstructed image of the subject.

* * * * *